US012568829B2

(12) United States Patent
Lee et al.

(10) Patent No.: US 12,568,829 B2
(45) Date of Patent: Mar. 3, 2026

(54) PACKAGING DEVICE INCLUDING BUMPS AND METHOD OF MANUFACTURING THE SAME

(71) Applicant: SK hynix Inc., Icheon-si (KR)

(72) Inventors: Jae Jun Lee, Icheon-si (KR); Jong Yeon Kim, Icheon-si (KR); Jong Hoon Kim, Icheon-si (KR); Ju Heon Yang, Icheon-si (KR); Mi Seon Lee, Icheon-si (KR)

(73) Assignee: SK hynic Inc., Icheon-si (KR)

( * ) Notice: Subject to any disclaimer, the term of this patent is extended or adjusted under 35 U.S.C. 154(b) by 415 days.

(21) Appl. No.: 18/186,284

(22) Filed: Mar. 20, 2023

(65) Prior Publication Data

US 2024/0105656 A1 Mar. 28, 2024

(30) Foreign Application Priority Data

Sep. 27, 2022 (KR) ........................ 10-2022-0122852

(51) Int. Cl.
*H01L 23/00* (2006.01)
*H01L 21/48* (2006.01)
*H01L 23/498* (2006.01)

(52) U.S. Cl.
CPC ............ *H01L 24/13* (2013.01); *H01L 21/485* (2013.01); *H01L 23/49811* (2013.01); *H01L 24/11* (2013.01); *H01L 24/16* (2013.01); *H01L 24/17* (2013.01); *H01L 2224/113* (2013.01); *H01L 2224/13007* (2013.01); *H01L*

*2224/13582* (2013.01); *H01L 2224/16147* (2013.01); *H01L 2224/16227* (2013.01);
(Continued)

(58) Field of Classification Search
CPC . H01L 24/13; H01L 21/485; H01L 23/49811; H01L 24/11
See application file for complete search history.

(56) References Cited

U.S. PATENT DOCUMENTS

| | | | | |
|---|---|---|---|---|
| 7,525,201 B2 * | 4/2009 | Takahira | ................. | H01L 24/81 |
| | | | | 257/E23.179 |
| 7,855,136 B2 * | 12/2010 | Takahira | ................. | H01L 24/05 |
| | | | | 257/E23.179 |

(Continued)

FOREIGN PATENT DOCUMENTS

| | | | | | |
|---|---|---|---|---|---|
| CN | 102956590 A | * | 3/2013 | ........... | H01L 23/585 |
| CN | 117790340 A | * | 3/2024 | ......... | H01L 21/4853 |

(Continued)

*Primary Examiner* — Laura M Menz
(74) *Attorney, Agent, or Firm* — WILLIAM PARK AND ASSOCIATES LTD.

(57) ABSTRACT

A packaging device including bumps and a method of manufacturing the packaging device are presented. In the method of manufacturing a packaging device, a dielectric layer that covers a packaging base is formed and a lower layer is formed over a packaging base including first and second connecting pads. A plurality of dummy bumps that overlaps with the dielectric layer is formed. A sealing pattern that covers the dummy bumps, filling areas between the dummy bumps, is formed. A lower layer pattern in which the plurality of dummy bumps have been disposed is formed by removing portions of the lower layer that are exposed and do not overlap with the sealing pattern.

10 Claims, 11 Drawing Sheets

(52) U.S. Cl.
CPC ............... *H01L 2224/17517* (2013.01); *H01L 2224/17519* (2013.01); *H01L 2924/384* (2013.01)

(56) References Cited

U.S. PATENT DOCUMENTS

| | | | | |
|---|---|---|---|---|
| 8,816,407 | B2 * | 8/2014 | Kim ..................... | H01L 23/481 257/260 |
| 9,449,931 | B2 | 9/2016 | Lin et al. | |
| 11,751,420 | B2 * | 9/2023 | Ahn ................... | H10K 59/8723 257/79 |
| 12,178,068 | B2 * | 12/2024 | Ahn ................... | H10K 59/8723 |
| 2004/0094841 | A1 * | 5/2004 | Matsuzaki ............. | H01L 24/12 257/E23.021 |
| 2006/0180928 | A1 * | 8/2006 | Takahira ................ | H01L 24/13 257/737 |
| 2013/0140688 | A1 * | 6/2013 | Chen ................. | H01L 21/76898 257/737 |
| 2013/0221493 | A1 * | 8/2013 | Kim .................... | H01L 21/6835 257/774 |
| 2021/0399254 | A1 * | 12/2021 | Ahn ................... | H10K 59/8723 |
| 2023/0371300 | A1 * | 11/2023 | Ahn ................... | H10K 59/8723 |
| 2024/0105656 | A1 * | 3/2024 | Lee ................... | H01L 23/49811 |
| 2024/0276838 | A1 * | 8/2024 | Choi ..................... | H10K 71/50 |
| 2025/0210589 | A1 * | 6/2025 | Liu ................... | H01L 21/76898 |

FOREIGN PATENT DOCUMENTS

| | | | | | |
|---|---|---|---|---|---|
| CN | 110137144 | B | * | 6/2024 | ............. H01L 21/56 |
| CN | 119601472 | A | * | 3/2025 | ............. H01L 24/11 |
| CN | 119947079 | A | * | 5/2025 | |
| JP | 4938936 | B2 | * | 5/2012 | |
| TW | 201324726 | A | * | 6/2013 | |
| WO | WO-2014112458 | A1 | * | 7/2014 | ......... H01L 23/5226 |

\* cited by examiner

PACKAGING DEVICE INCLUDING BUMPS AND METHOD OF MANUFACTURING THE SAME

CROSS-REFERENCE TO RELATED APPLICATION

The present application claims priority under 35 U.S.C. § 119(a) to Korean application number 10-2022-0122852, filed in the Korean Intellectual Property Office on Sep. 27, 2022, the entire disclosure of which is incorporated herein by reference.

BACKGROUND

The present disclosure relates to a semiconductor technology and, particularly, to a packaging device including bumps and a method of manufacturing the same.

A packaging device may include a device in which a semiconductor device or an integrated circuit device is packaged. As performance of a semiconductor device, the degree of integration of semiconductor devices, and the speed of a semiconductor device are increased and the size of a semiconductor device is reduced, the number of connecting terminals or input/output (I/O) terminals for an interconnection that is required for the semiconductor device is increased. Accordingly, conductive bumps are adopted as connecting elements for the semiconductor device. For example, conductive bumps are adopted as connecting elements for a high bandwidth memory product. As the number and density of bumps are increased, the size of the bump is reduced. As the size of the bump is reduced, a failure in which bumps are detached from a semiconductor device without maintaining the state in which the bumps have been coupled to the semiconductor device may occur.

SUMMARY

An embodiment may present a method of manufacturing a packaging device, including forming, on a packaging base including first and second connecting pads, a dielectric layer that covers the packaging base and exposes the first and second connecting pads, forming a lower layer that covers the dielectric layer and the first and second connecting pads, forming a plurality of dummy bumps that overlaps with the dielectric layer, forming a sealing pattern that fills areas between the dummy bumps, and forming a first lower layer pattern on which the plurality of dummy bumps have been disposed by removing portions of the lower layer that are exposed and do not overlap with the sealing pattern.

An embodiment may present a packaging device, including first and second connecting pads that are disposed in a packaging base, a dielectric layer that covers the packaging base and exposes the first and second connecting pads, a first lower layer pattern that is formed on the dielectric layer, and a plurality of dummy bumps that are disposed on the first lower layer pattern.

BRIEF DESCRIPTION OF THE DRAWINGS

FIG. 5 is a schematic cross-sectional view illustrating that a sealing pattern in a method of manufacturing a packaging device according to an embodiment has been formed.

FIG. 6 is a schematic cross-sectional view illustrating that lower layer patterns in a method of manufacturing a packaging device according to an embodiment have been formed.

FIG. 7 is a schematic cross-sectional view illustrating a packaging device according to an embodiment.

FIG. 8 is a schematic cross-sectional view illustrating that a sealing pattern in a method of manufacturing a packaging device according to another embodiment has been formed.

FIG. 9 is a schematic cross-sectional view illustrating that lower layer patterns in a method of manufacturing a packaging device according to another embodiment are formed.

FIG. 10 is a schematic cross-sectional view illustrating a device package according to another embodiment.

DETAILED DESCRIPTION

Figure 1:
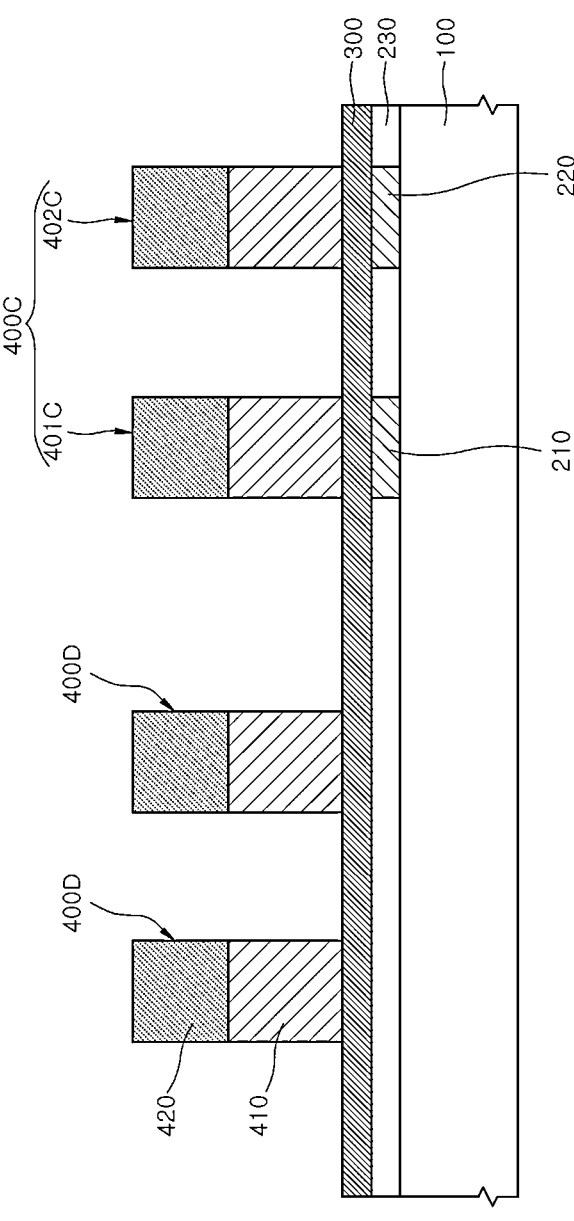
FIG. 1 is a schematic cross-sectional view illustrating that bumps in a method of manufacturing a packaging device according to an embodiment have been formed.

Terms that are used in the description of examples of this application are terms selected by taking into consideration functions in proposed embodiments, and the meanings of the terms may be different depending on a user, an operator's intention or practice in the technical field. The meaning of a term used follows the definition of the term if the term has been specifically defined in this specification and may be interpreted as a meaning which may be commonly recognized by those skilled in the art if the term has not been specifically defined.

In the description of examples of this application, terms, such as a "first", a 'second", a "side", a "top", and a "bottom or lower", are used to distinguish between members and are not used to limit the members themselves or to mean a specific order.

A semiconductor substrate may denote a semiconductor wafer on which electronic parts and elements are integrated. Integrated circuits may be integrated on the semiconductor substrate. The semiconductor substrate may be diced into a plurality of semiconductor chips or a plurality of semiconductor dies.

The semiconductor chip may be a memory chip on which memory devices, such as DRAM, SRAM, NAND flash memory, NOR flash memory, MRAM, ReRAM, FeRAM, or PcRAM, have been integrated. The semiconductor chip may denote a logic die or an ASIC chip, an application processor (AP), a graphic processing unit (GPU), a central processing unit (CPU), or a system on chip (SoC) in which logic circuits have been integrated on a semiconductor substrate.

The semiconductor chip may be a component that constitutes a semiconductor package or a semiconductor product. The semiconductor chip may be applied to information communication devices such as a mobile terminal, bio or health care-related electronic devices, and electronic devices wearable by human beings. The semiconductor chip may be applied to Internet of Things.

In the entire specification, the same reference numerals may denote the same components. Accordingly, the same reference numerals or similar reference numerals may be described with reference to other drawings although they are not mentioned or described in corresponding drawings.

Furthermore, although reference numerals are not shown, they may be described with reference to other drawings.

FIG. 1 is a schematic cross-sectional view illustrating that bumps 400D and 400C in a method of manufacturing a packaging device according to an embodiment have been formed.

Referring to FIG. 1, a dielectric layer 230 may be formed on a packaging base 100. The packaging base 100 may include a semiconductor substrate in which integrated circuit elements have been integrated. The integrated circuit element may include a volatile memory device, such as dynamic random access memory (DRAM), or a nonvolatile memory device, such as NAND flash memory. The semiconductor substrate may be a substrate that includes silicon (Si) or germanium (Ge) or may be a substrate that includes silicon carbide (SiC), gallium arsenide (GaAs), indium arsenide (InAs), or indium phosphorous (InP). The packaging base 100 may include an interconnection component, such as a printed circuit board (PCB) on which semiconductor devices or electronic devices are mounted.

The packaging base 100 may include a first connecting pad 210 and a second connecting pad 220. The first connecting pad 210 and the second connecting pad 220 may be connecting elements that are electrically connected to integrated circuit elements that are integrated within the packaging base 100. The first connecting pad 210 and the second connecting pad 220 may include a metal layer, such as an aluminum (Al) layer or a copper (Cu) layer. The first connecting pad 210 and the second connecting pad 220 may be portions of conductive traces.

The dielectric layer 230 may be formed as a protection layer that covers and protects the packaging base 100. The dielectric layer 230 may include a passivation layer. The dielectric layer 230 may include a polymer layer. The dielectric layer 230 may be formed on the packaging base 100 so that the first connecting pad 210 and the second connecting pad 220 are exposed. The dielectric layer 230 may be formed so that a part of the first connecting pad 210 and a portion of the second connecting pad 220 are exposed.

A lower layer 300 that covers the dielectric layer 230 and extends to cover the first and second connecting pads 210 and 220 may be formed on the dielectric layer 230. The lower layer 300 may be formed as a plating seed layer for forming the bumps 400D and 400C through a plating process. The lower layer 300 may include metal, such as copper (Cu), nickel (Ni), or gold (Au). The lower layer 300 may include an under bump metallurgy (UBM) layer. The lower layer 300 may act as a layer that easily induces the bonding of the bumps 400D and 400C and prevents diffusion into the underlying packaging base 100.

The bumps 400D and 400C may be formed on the lower layer 300. The bumps 400D and 400C may include a stack of a bump body layer 410 and a solder layer 420. The bump body layer 410 may be formed between the solder layer 420 and the lower layer 300. The bump body layer 410 may include metal, such as copper (Cu) or gold (Au).

The bumps 400D and 400C may be divided into a plurality of dummy bumps 400D and a plurality of connecting bumps 400C. The connecting bumps 400C may be formed as the dummy bumps 400D are formed. The connecting bumps 400C may be real bumps that are connected to or are to be connected to the connecting pads 210 and 220. The connecting bumps 400C may be bumps that are connected to or are to be connected to the first and second connecting pads 210 and 220, one by one. The connecting bumps 400C may be disposed to overlap with the first and second connecting pads 210 and 220, respectively. A first connecting bump 401C may be formed to overlap with the first connecting pad 210, and a second connecting bump 402C may be formed to overlap with the second connecting pad 220.

The dummy bumps 400D may be disposed to overlap with the dielectric layer 230. The dummy bumps 400D may be bumps that will be electrically isolated from the first and second connecting pads 210 and 220 through a subsequent process of separating the lower layer 300. The dummy bumps 400D might not act as elements for an electrical connection and may act to balance another element by supporting the other element or increase a mechanical coupling force between the packaging base 100 and the other element when the connecting bumps 400C is bonded to the other element. The dummy bumps 400D may act as an element that dissipates heat that may be generated from the packaging base 100.

Figure 2:
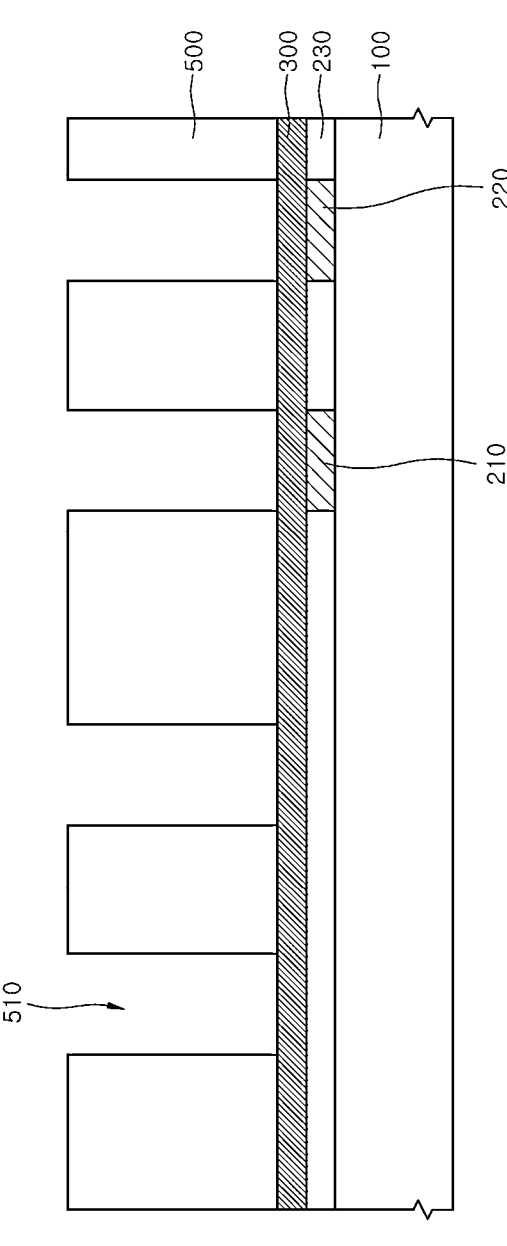
FIGS. 2 to 4 are schematic cross-sectional views illustrating detailed process steps of forming the bumps in FIG. 1.
Figure 3:
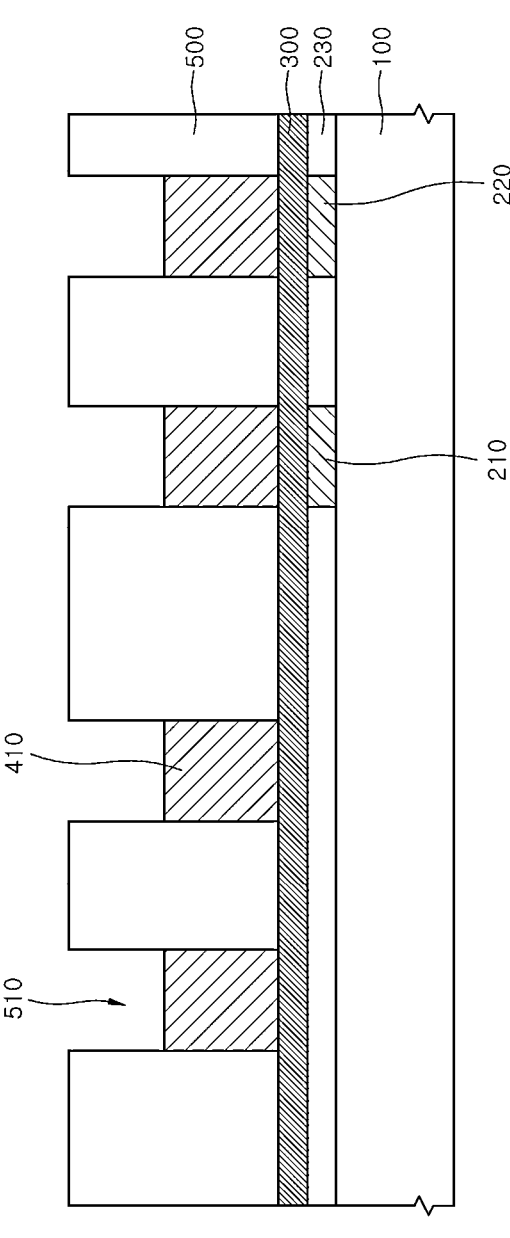
Figure 4:
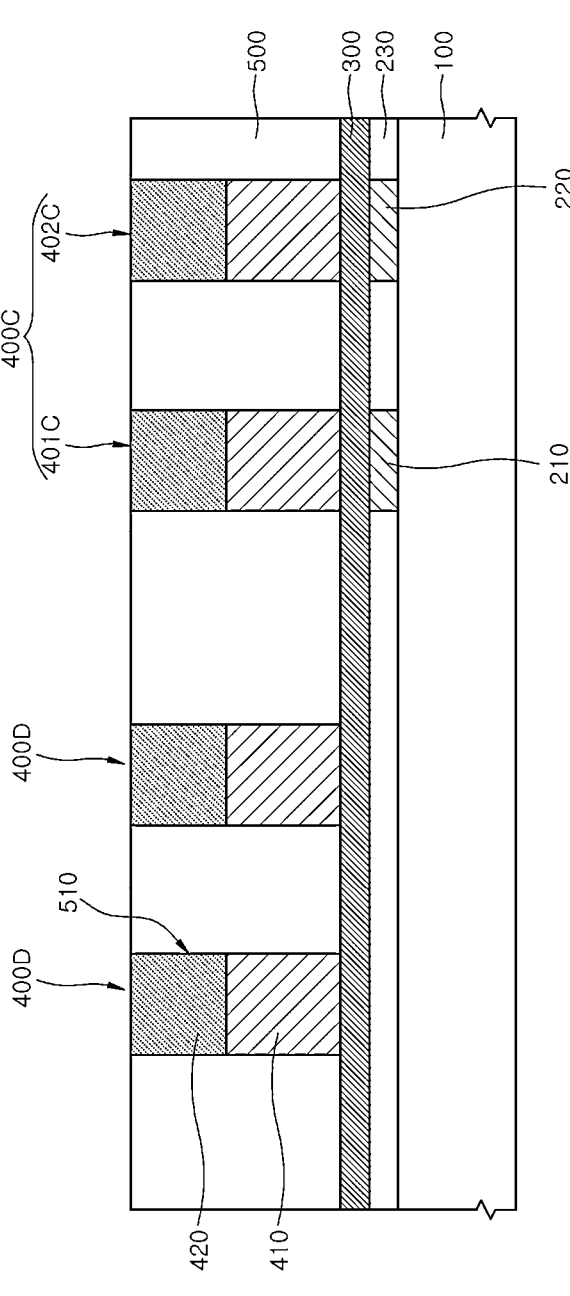

FIGS. 2 to 4 are schematic cross-sectional views illustrating detailed process steps of forming the bumps 400D and 400C in FIG. 1.

Referring to FIGS. 1 and 2, a mask pattern 500 that includes first openings 510 in which the bumps 400D and 400C will be formed may be formed. A photoresist layer may be formed on the lower layer 300. The first openings 510 may be formed in the photoresist layer by exposing and developing the photoresist layer. The mask pattern 500 may be formed as the photoresist layer in which the first openings 510 have been formed as described above. Since the bumps 400D and 400C may be formed to fill the first openings 510, the mask pattern 500 may be formed as a mold or a die that assigns shapes for the bumps 400D and 400C. The mask pattern 500 may be formed as a plating resist pattern for plating when the bumps 400D and 400C are formed through a plating process.

Referring to FIGS. 1 and 3, the bump body layer 410 that partially fills the first openings 510 may be formed. The bump body layer 410 may be plated through a plating process by using the lower layer 300 as a plating seed layer.

Referring to FIGS. 1 and 4, the solder layer 420 that fills the first openings 510 may be formed on the bump body layer 410. The solder layer 420 may be plated on the bump body layer 410 through a plating process. As described above, the bumps 400D and 400C may be formed by filling the first openings 510 with conductive substances, such as the bump body layer 410 and the solder layer 420. As the plurality of dummy bumps 400D overlapping with portions of the dielectric layer 230, respectively, are being formed, the first and second connecting bumps 401C and 402C that overlap with the first and second connecting pads 210 and 220, respectively, may also be formed through a plating process. After the bumps 400D and 400C are formed, the mask pattern 500 may be removed.

Figure 5:
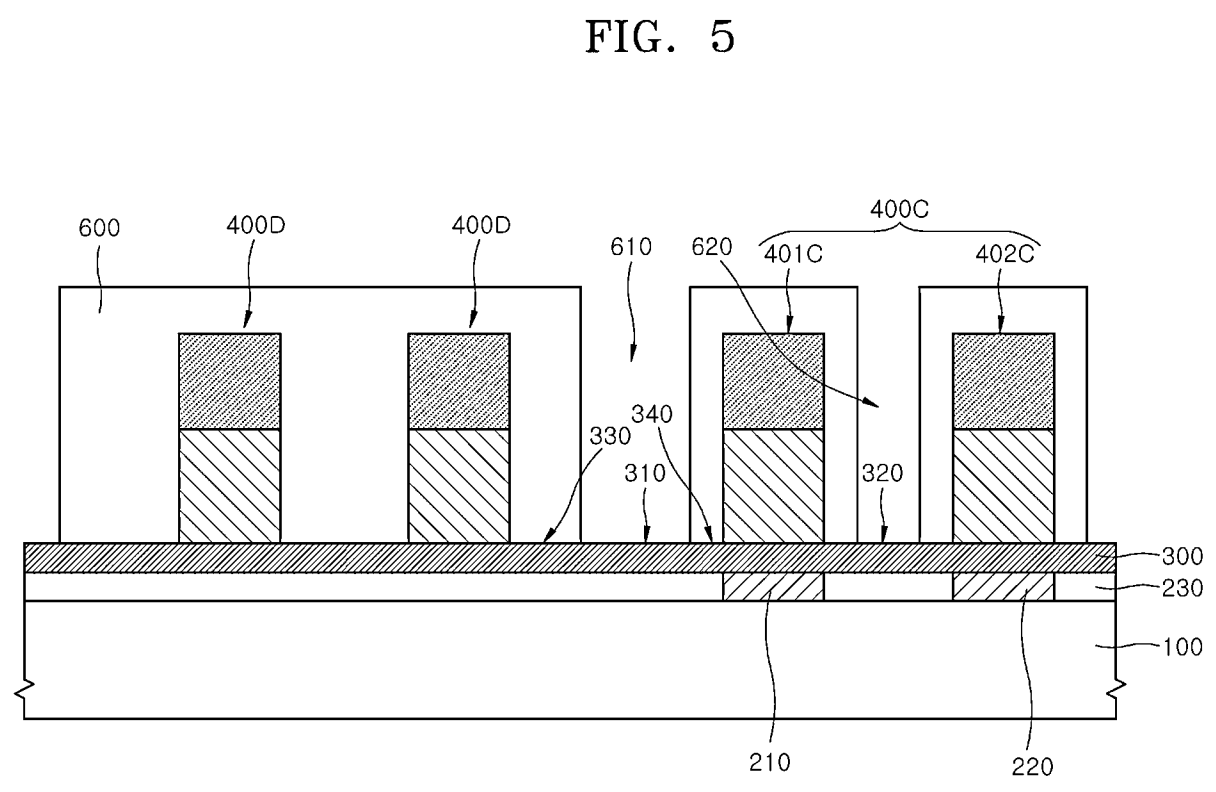

FIG. 5 is a schematic cross-sectional view illustrating that a sealing pattern 600 in a method of manufacturing a packaging device according to an embodiment has been formed.

Referring to FIG. 5, the sealing pattern 600, a photoresist layer, filling areas around and between the dummy bumps 400D, may be formed. In other words, the sealing pattern 600 may cover the bumps 400D and 400C and portions of the lower layer 300. A second opening 610 and a third opening 620 may be formed in the sealing pattern 600 by exposing and developing the sealing pattern 600. As described above, sealing pattern 600 may be formed as the photoresist layer in which the second and third openings 610 and 620 have been formed.

The sealing pattern 600 may be further extended to cover the dummy bumps 400D and to cover a portion 330 of the lower layer 300, which does not overlap with the dummy bumps 400D and is adjacent to the dummy bumps 400D. The second opening 610 that is formed in the sealing pattern 600 may be an opening between one of the dummy bumps 400D and the first connecting bump 401C, that is, one of the connecting bumps 400C. The second opening 610 of the sealing pattern 600 may be formed to expose another portion 310 of the lower layer 300, which is disposed between the dummy bump 400D and the first connecting bump 401C.

The sealing pattern 600 may further provide an opening between the connecting bumps 400C. The third opening 620 of the sealing pattern 600 may be an opening between the first connecting bump 401C and the second connecting bump 402C. The third opening 620 of the sealing pattern 600 may be formed to expose still another portion 320 of the lower layer 300, which is disposed between the first connecting bump 401C and the second connecting bump 402C. The sealing pattern 600 may be extended to seal the connecting bumps 400C by covering each of the connecting bumps 400C. The sealing pattern 600 may be further extended to cover the connecting bumps 400C and to cover a portion 340 of the lower layer 300, which does not overlap with the connecting bumps 400C and is adjacent to the connecting bumps 400C.

Figure 6:
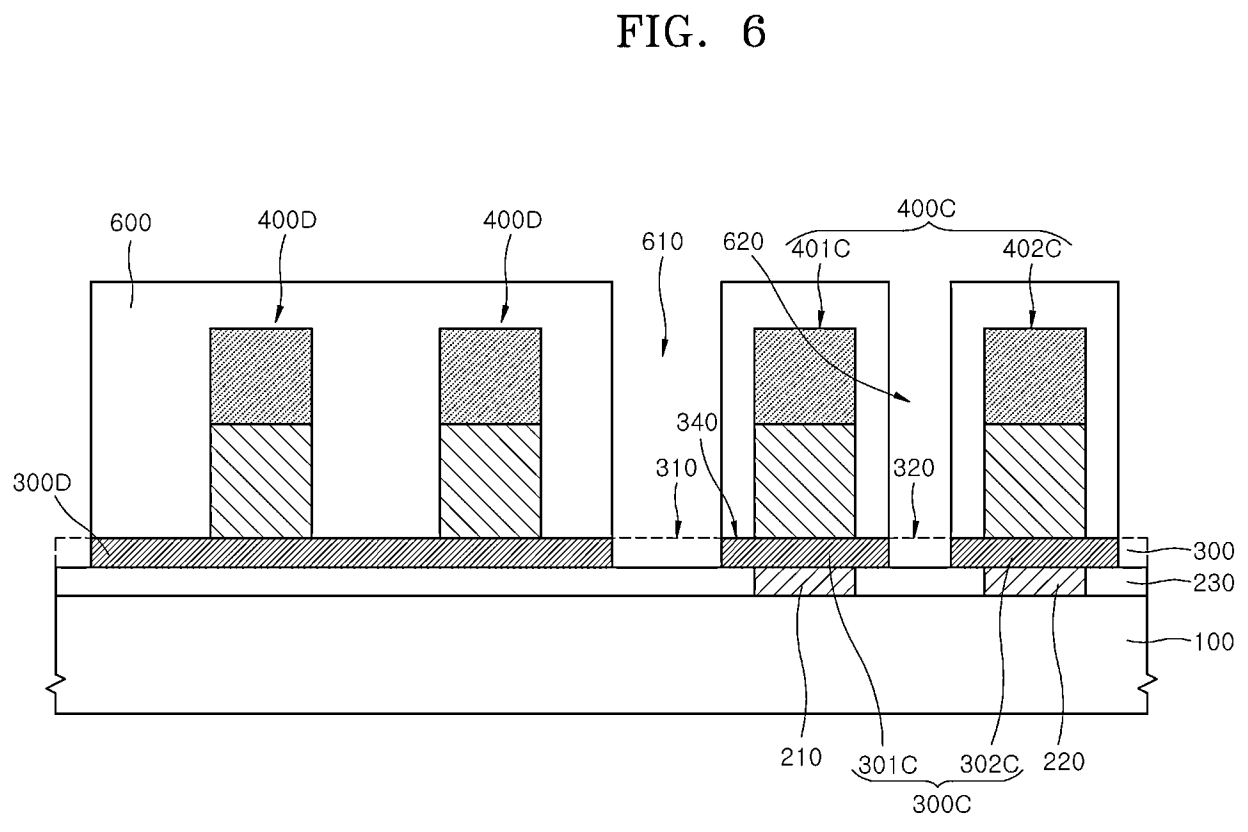

FIG. 6 is a schematic cross-sectional view illustrating that lower layer patterns 300D and 300C in a method of manufacturing a packaging device according to an embodiment have been formed.

Referring to FIG. 6, portions 310 and 320 of the lower layer 300, which have been exposed by the sealing pattern 600, may be selectively removed. As the exposed portions 310 and 320 of the lower layer 300 are removed, a first lower layer pattern 300D and second lower layer patterns 300C may be formed. As the first lower layer pattern 300D is formed, the second lower layer patterns 300C may be formed. The exposed portions 310 and 320 of the lower layer 300 may be selectively removed through a selective etch process using the sealing pattern 600 as an etch mask. As described above, the lower layer 300 may be patterned through an etch process for the lower layer 300 by using the sealing pattern 600. Through such an etch process, the first and second lower layer patterns 300D and 300C may be patterned together.

The first lower layer pattern 300D may have a shape in which the plurality of dummy bumps 400D is disposed together. The first lower layer pattern 300D may be formed in a shape that connects the plurality of dummy bumps 400D. The first lower layer pattern 300D may be formed in a shape that is bonded to a surface of the dielectric layer 230. Accordingly, the dummy bumps 400D may be electrically isolated from the first and second connecting pads 210 and 220 by the dielectric layer 230.

As the portions 310 of the lower layer 300, which has been exposed by the second opening 610 of the sealing pattern 600, are selectively removed, the first lower layer pattern 300D may be electrically isolated from the first connecting bump 401C. As the portions 320 of the lower layer 300, which has been exposed by the third opening 620 of the sealing pattern 600, are selectively removed, the first connecting bump 401C and the second connecting bump 402C may be electrically isolated from each other, and a second lower layer-first pattern 301C and a second lower layer-second pattern 302C may be separated from the lower layer 300. A shape in which the connecting bumps 400C are bonded to the second lower layer patterns 300C, respectively, may be formed. A shape in which the first connecting bump 401C is bonded to the second lower layer-first pattern 301C and the first connecting bump 401C is bonded to the second lower layer-second pattern 302C may be formed. The second lower layer patterns 300C including the second lower layer-first pattern 301C and the second lower layer-second pattern 302C may be patterns that have been electrically isolated from each other.

Still another portion 340 of the lower layer 300, which is sealed by the sealing pattern 600, may remain as a protruding part 340 that has protruded away from the connecting bumps 400C. The second lower layer patterns 300C may have a shape including the protruding part 340 and may be patterned in a shape that has a greater width than the connecting bumps 400C.

Figure 7:
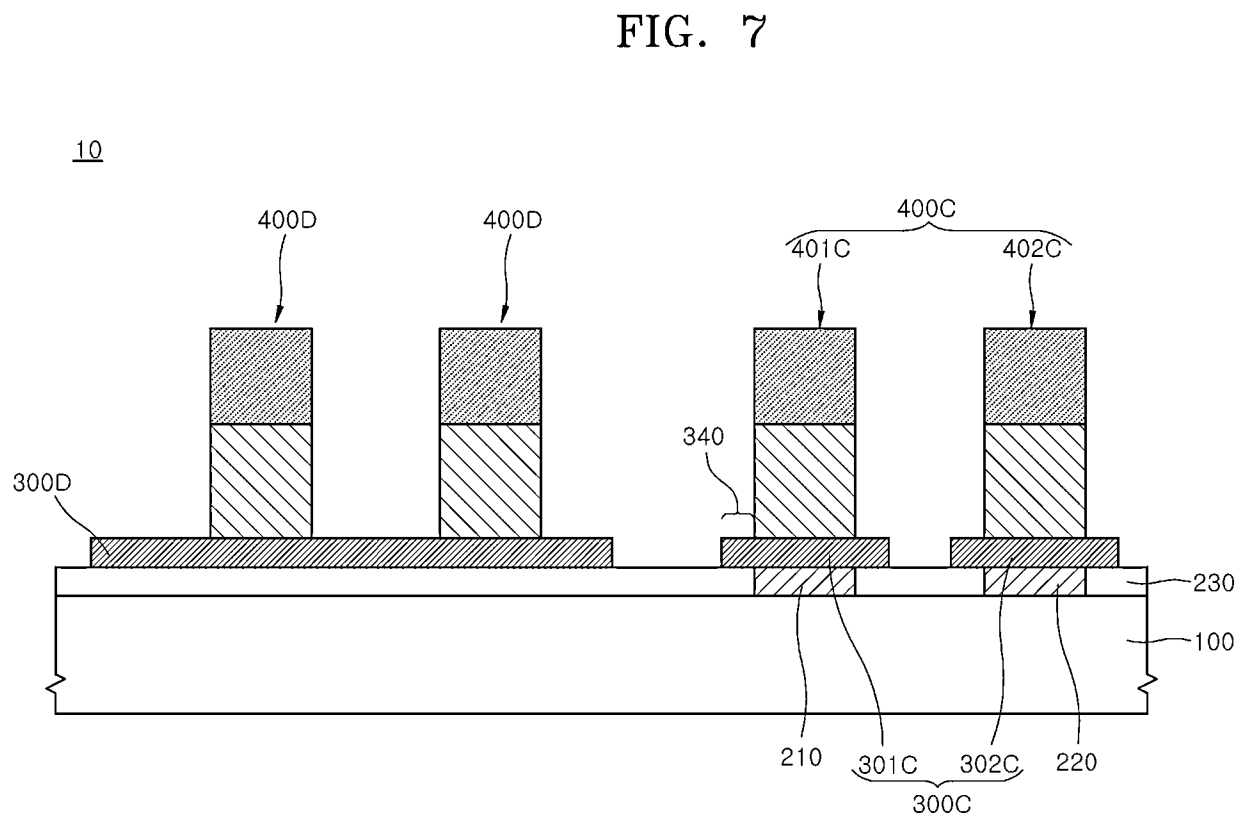

FIG. 7 is a schematic cross-sectional view illustrating that a packaging device 10 according to an embodiment has been formed.

Referring to FIGS. 6 and 7, after the first and second lower layer patterns 300D and 300C are separated from each other through patterning, the sealing pattern 600 that is used as the etch mask may be removed. As the sealing pattern 600 is being removed, the packaging device 10 in which the plurality of dummy bumps 400D has been disposed in a single first lower layer pattern 300D may be implemented.

The packaging device 10 may include the first and second connecting pads 210 and 220, the dielectric layer 230, the first lower layer pattern 300D, the second lower layer patterns 300C, the dummy bumps 400D, and the connecting bumps 400C that are disposed in the packaging base 100. Since the packaging base 100 may include a semiconductor substrate, the packaging device 10 may be constituted with a semiconductor device or an integrated circuit device. The first lower layer pattern 300D may be bonded to the dielectric layer 230. The second lower layer patterns 300C may be bonded to the connecting pads 210 and 220. The bonding of the second lower layer patterns 300C and the connecting pads 210 and 220 may be based on the generation of an intermetallic compound and may have relatively great bonding power. In contrast, the bonding of the first lower layer pattern 300D and the dielectric layer 230 might not generate an intermetallic compound and may have relatively small bonding power. The first lower layer pattern 300D may be patterned in a shape that has a relatively greater area or greater width than the second lower layer patterns 300C so that the plurality of dummy bumps 400D may be interconnected. The first lower layer pattern 300D that is formed to have a relatively greater width or greater area as described above can increase bonding power with the dielectric layer 230 by compensating for relatively small bonding power with the dielectric layer 230. Accordingly, a bonding failure in which the dummy bumps 400D is separated or missed from the dielectric layer 230 or the packaging base 100 can be reduced or suppressed.

The second lower layer patterns 300C may be formed in a way to be spaced apart from each other and may be directly bonded to the first and second connecting pads 210 and 220, respectively. The second lower layer patterns 300C may have a shape including the protruding portions 340 and may be patterned in a shape having a greater width than a shape of the connecting bumps 400C that are bonded to the second lower layer patterns 300C, respectively. Accordingly, an unwanted reduction in bonding power between the second lower layer pattern 300C and the first and second connecting pads 210 and 220 can be suppressed or reduced. When portions (310 and 320 in FIG. 6) of the lower layer (300 in FIG. 6) are removed, an undercut phenomenon in which edge portions of the second lower layer pattern 300C are excessively removed may occur. Such an undercut phenomenon may reduce the width of the second lower layer pattern 300C. The protruding part 340 of the second lower layer pattern 300C may act as a structure capable of suppressing or reducing the undercut phenomenon.

Figure 8:
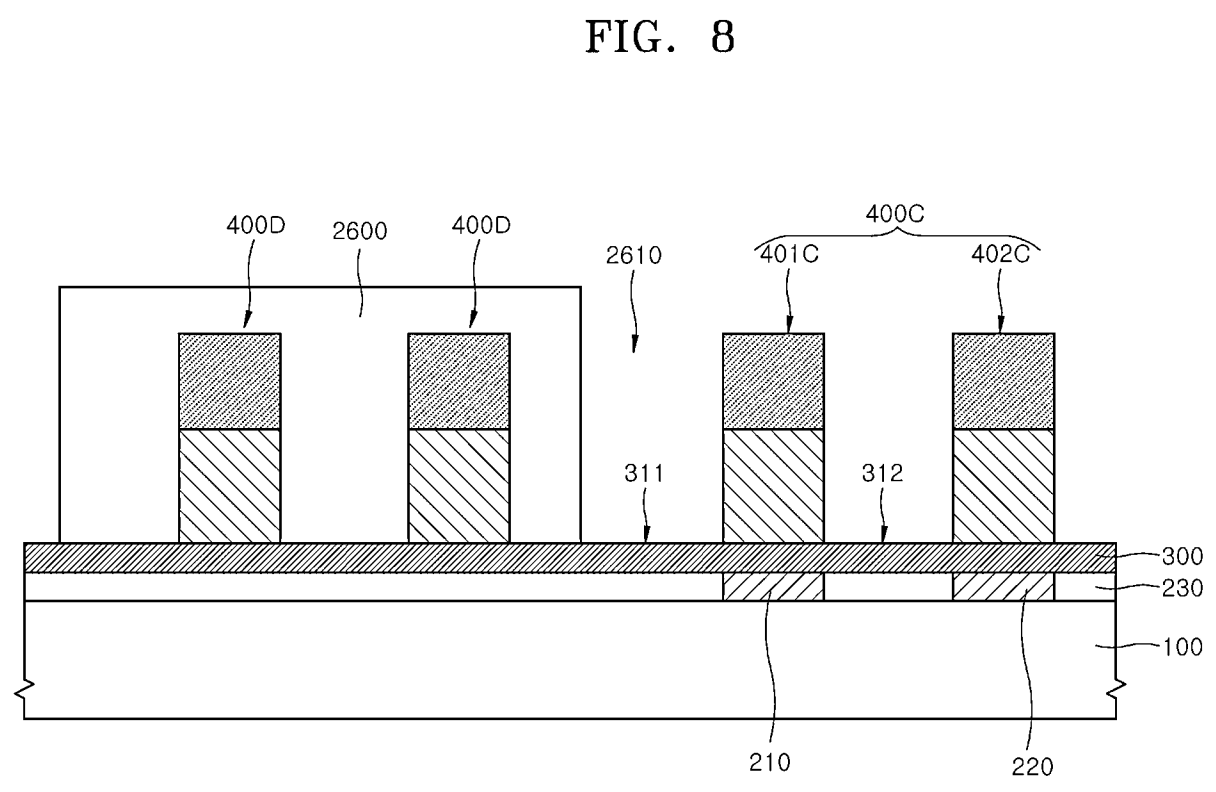

FIG. 8 is a schematic cross-sectional view illustrating that a sealing pattern 2600 in a method of manufacturing a packaging device according to another embodiment has been formed.

Referring to FIG. 8, the sealing pattern 2600 that fills an area around and between the dummy bumps 400D may be formed. The sealing pattern 2600 may be further extended to cover the dummy bumps 400D. The sealing pattern 2600 may include a fourth opening 2610 that provides an opening for the dummy bumps 400D in regions other than the region between the dummy bumps 400D. The fourth opening 2610 of the sealing pattern 2600 may expose the connecting bumps 400C and may be an opening between one of the dummy bumps 400D and the first connecting bump 401C, that is, one of the connecting bumps 400C. The fourth opening 2610 of the sealing pattern 2600 may be formed to expose another portion 311 of the lower layer 300, which is disposed between the dummy bump 400D and the first connecting bump 401C. The fourth opening 2610 of the sealing pattern 2600 may be further extended to expose the connecting bumps 400C and to further provide an opening between the connecting bumps 400C. The fourth opening 2610 of the sealing pattern 2600 may further provide an opening between the first connecting bump 401C and the second connecting bump 402C. The fourth opening 2610 of the sealing pattern 2600 may be formed to expose still another portion 312 of the lower layer 300, which is disposed between the first connecting bump 401C and the second connecting bump 402C.

Figure 9:
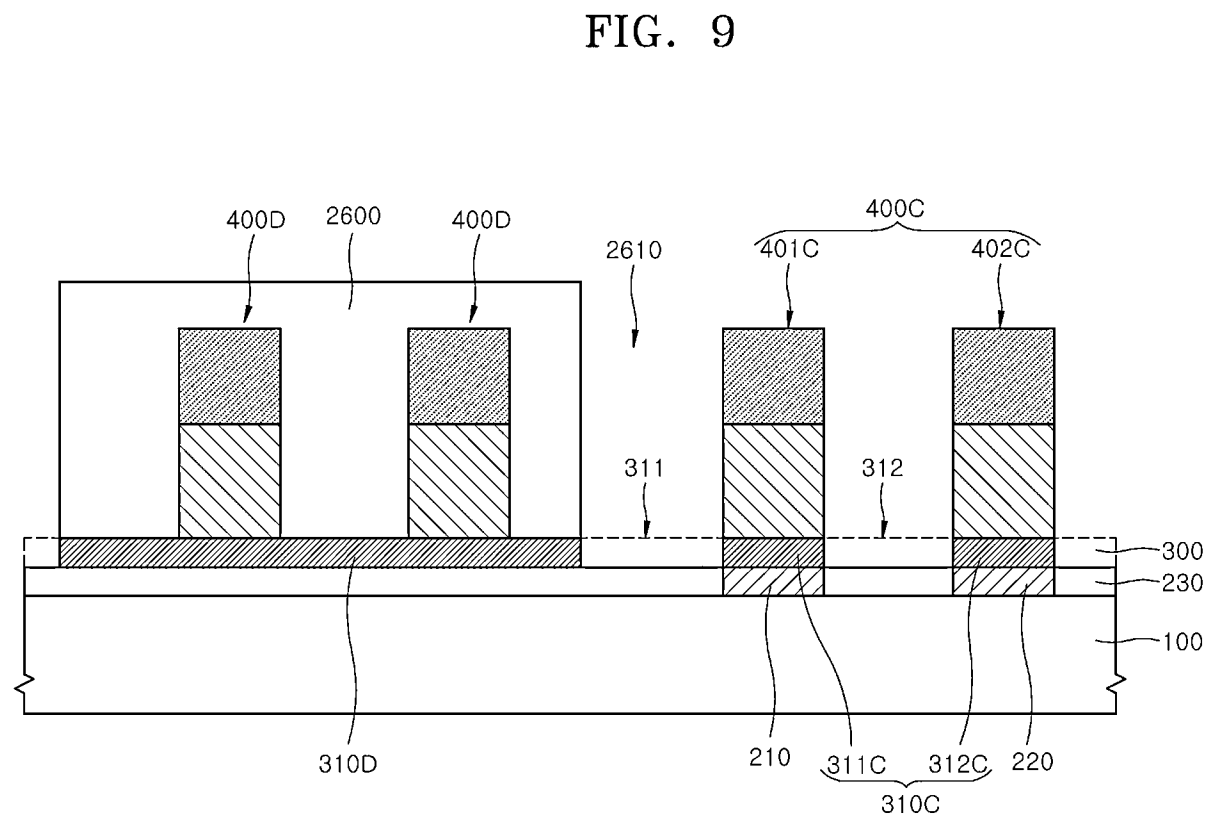

FIG. 9 is a schematic cross-sectional view illustrating that lower layer patterns 310D and 310C in a method of manufacturing a packaging device according to another embodiment are formed.

Referring to FIG. 9, the portions 311 and 312 of the lower layer 300, which have been exposed by the sealing pattern 2600, may be selectively removed. As the portions 311 and 312 of the lower layer 300 are being removed, a first lower layer pattern 310D and second lower layer patterns 310C may be formed. As the first lower layer pattern 310D is being formed, the second lower layer patterns 310C may be formed. The exposed portions 311 and 312 of the lower layer 300 may be selectively removed through a selective etch process by using the sealing pattern 2600 and the connecting bumps 400C as an etch mask. The lower layer 300 may be patterned through the etch process for the lower layer 300 by using the sealing pattern 2600 and the connecting bumps 400C as described above. Through such an etch process, the first and second lower layer patterns 310D and 310C may be patterned together.

The first lower layer pattern 310D may have a shape in which the plurality of dummy bumps 400D has been disposed together. As the portions 311 and 312 of the lower layer 300, which have been exposed by the fourth opening 2610 of the sealing pattern 2600 and the connecting bumps 400C, are being selectively removed, the first lower layer pattern 310D may be electrically isolated from the first connecting bump 401C, and the first connecting bump 401C and the second connecting bump 402C may be electrically isolated from each other. As the portions 312 of the lower layer 300, which has been exposed by the fourth opening 2610 of the sealing pattern 2600 and the connecting bumps

400C, are being selectively removed, the second lower layer-first pattern 311C and the second lower layer-second pattern 312C may be separated from the lower layer 300. The second lower layer patterns 301C may be patterned to have the same width as the connecting bumps 400C.

Figure 10:
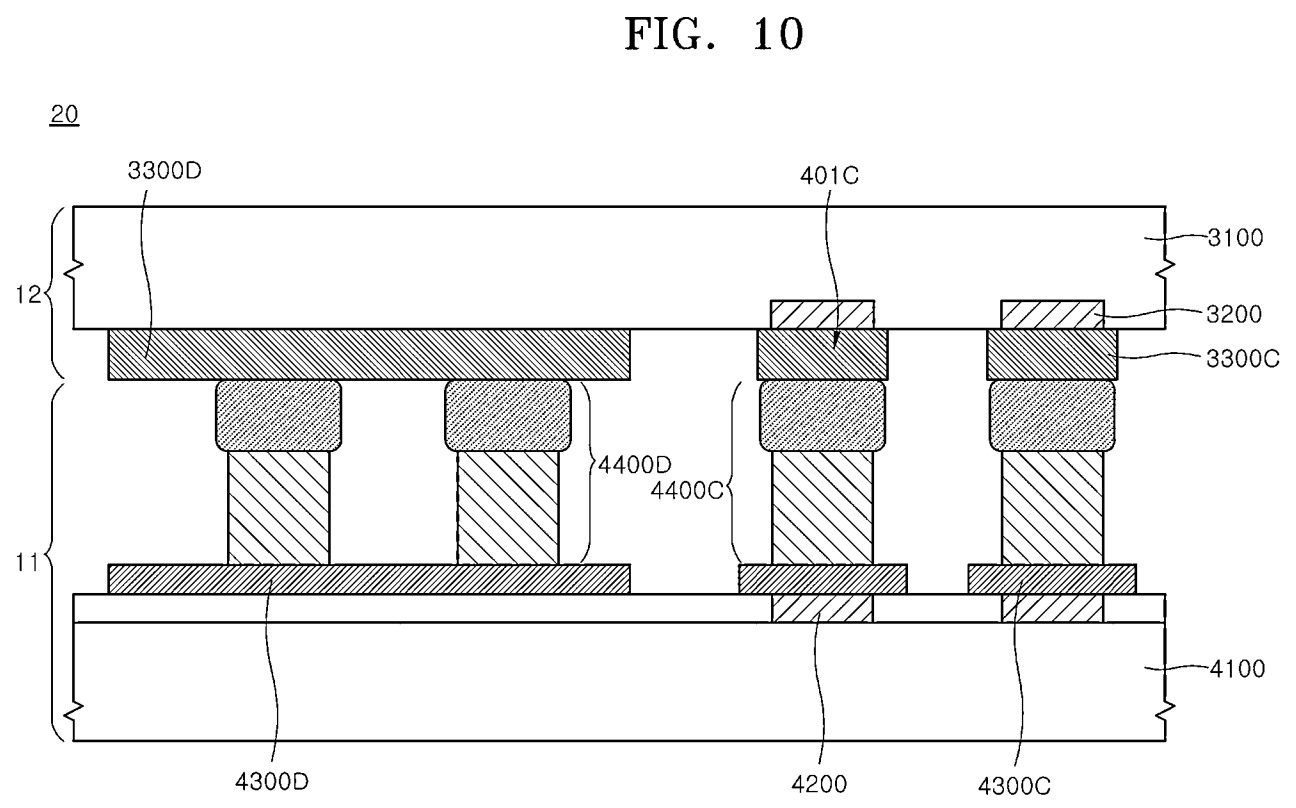

FIG. 10 is a schematic cross-sectional view illustrating a device package 20 according to another embodiment.

Referring to FIG. 10, a lower packaging device 11 may constitute the device package 20 by being bonded to an upper packaging device 12 through bumps 4400D and 4400C. The lower packaging device 11 may include a first lower layer pattern 4300D to which a plurality of lower dummy bumps 4400D has been bonded on a lower packaging base 4100 and may include second lower layer patterns 4300C and lower connecting bumps 4400C that are bonded to connecting pads 4200, respectively. The upper packaging device 12 may include upper connecting lands 3300C that are bonded to upper connecting pads 3200 that are disposed in an upper packaging base 3100, respectively, and an upper dummy land 3300D. The lower connecting bumps 4400C may be bonded to the upper connecting lands 3300C, respectively, and the lower dummy bump 4400D may be bonded to the upper dummy land 3300D. Accordingly, the device package 20 having a structure in which the packaging bases 4100 and 3100 have been stacked may be implemented. The lower dummy bump 4400C may act as a supporter that supports the upper packaging base 3100 or a heat dissipation path for heat dissipation.

Figure 11:
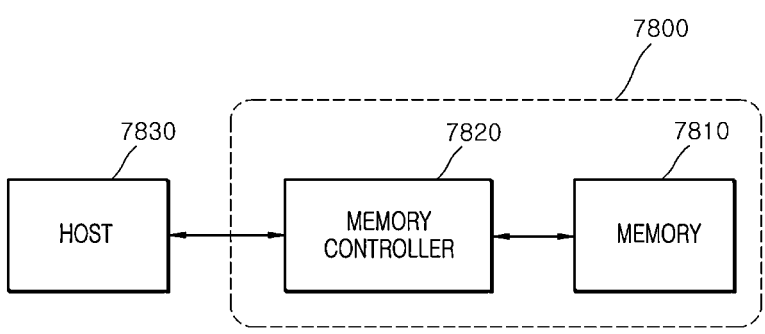
FIG. 11 is a block diagram illustrating an electronic system using a memory card including a packaging device according to an embodiment.

FIG. 11 is a block diagram illustrating an electronic system including a memory card 7800 employing at least one of the packaging devices according to the embodiments. The memory card 7800 may include a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 12:
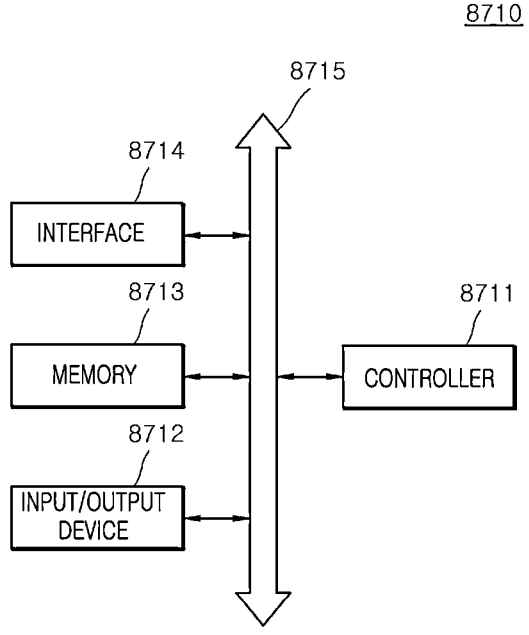
FIG. 12 is a block diagram illustrating an electronic system including a packaging device according to an embodiment.

FIG. 12 is a block diagram illustrating an electronic system 8710 including at least one of the packaging devices according to the embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include at least one of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system, such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution) or Wibro (wireless broadband Internet).

The embodiments of the present disclosure have been described so far. A person having ordinary knowledge in the art to which the present invention pertains will understand that the present invention may be implemented in a modified form without departing from an intrinsic characteristic of the present disclosure. Accordingly, the disclosed embodiments should be considered from a descriptive viewpoint, not from a limitative viewpoint. The range of the present disclosure is described in the claims not the aforementioned description, and all differences within an equivalent range thereof should be construed as being included in the present disclosure.

What is claimed is:

1. A method of manufacturing a packaging device, comprising:

forming, on a packaging base including first and second connecting pads, a dielectric layer that covers the packaging base and exposes the first and second connecting pads;

forming a lower layer that covers the dielectric layer and the first and second connecting pads;

forming a plurality of dummy bumps that overlaps with the dielectric layer;

forming a sealing pattern that fills areas between the dummy bumps; and forming a first lower layer pattern on which the plurality of dummy bumps have been disposed by removing portions of the lower layer that are exposed and do not overlap with the sealing pattern.

2. The method of claim 1, wherein:

connecting bumps that overlap with the first and second connecting pads, respectively, are formed while forming the dummy bumps, and as the first lower layer pattern is being formed, second lower layer patterns that are bonded to the connecting bumps, respectively, are formed.

3. The method of claim 2, wherein the sealing pattern is further extended to cover the dummy bumps and to provide an opening the connecting bumps and area between the connecting bumps.

4. The method of claim 2, wherein, while sealing the dummy bumps and the connecting bumps by covering the dummy bumps and the connecting bumps with the sealing pattern, the sealing pattern further provides openings between one of the dummy bumps and one of the connecting bumps and between the connecting bumps.

5. The method of claim 2, wherein the forming of the dummy bumps and the connecting bumps comprises:

forming a mask pattern comprising openings that expose a portion of the lower layer; and filling the openings with conductive substances, respectively.

6. The method of claim 5, further comprising removing the mask pattern before forming the sealing pattern.

7. The method of claim 1, wherein the first lower layer pattern is formed to interconnect the plurality of dummy bumps.

8. The method of claim 1, wherein the first lower layer pattern is formed to be bonded to the dielectric layer and electrically isolated from the first and second connecting pads.

9. The method of claim 1, wherein the lower layer comprises an under bump metallurgy (UBM) layer.

10. The method of claim 1, wherein the packaging base comprises a semiconductor substrate or a printed circuit board (PCB).

* * * * *